(12) United States Patent
Siau et al.

(10) Patent No.: US 9,361,976 B2
(45) Date of Patent: Jun. 7, 2016

(54) SENSE AMPLIFIER INCLUDING A SINGLE-TRANSISTOR AMPLIFIER AND LEVEL SHIFTER AND METHODS THEREFOR

(71) Applicant: SanDisk 3D LLC, Milpitas, CA (US)

(72) Inventors: Chang Siau, Saratoga, CA (US); Yingchang Chen, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/539,150

(22) Filed: Nov. 12, 2014

(65) Prior Publication Data
US 2016/0133320 A1    May 12, 2016

(51) Int. Cl.
*G11C 11/00* (2006.01)
*G11C 13/00* (2006.01)

(52) U.S. Cl.
CPC ...... *G11C 13/004* (2013.01); *G11C 2013/0054* (2013.01)

(58) Field of Classification Search
CPC .......... G11C 13/0069; G11C 13/0004; G11C 11/4091; G11C 7/065
USPC ..................... 365/148, 205, 189.12
See application file for complete search history.

(56) References Cited

U.S. PATENT DOCUMENTS

2006/0146590 A1* 7/2006 Fukushi ................ G11C 11/22
365/145

* cited by examiner

*Primary Examiner* — Huan Hoang
(74) *Attorney, Agent, or Firm* — Vierra Magen Marcus LLP

(57) ABSTRACT

Methods are provided for use with a memory array that includes a selected memory cell coupled to a selected word line and a selected bit line, with the selected word line biased at a read voltage. The method include coupling a sense amplifier to the selected bit line, the sense amplifier including a capacitor integrator, a single-transistor amplifier and a level shifter, maintaining the selected bit line at a voltage of substantially 0V using the single-transistor amplifier and the level shifter, and integrating a selected bit line current on the capacitor integrator.

20 Claims, 15 Drawing Sheets

SENSE AMPLIFIER INCLUDING A SINGLE-TRANSISTOR AMPLIFIER AND LEVEL SHIFTER AND METHODS THEREFOR

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled to reduce the cost per bit. However, as process geometries shrink, many design and process challenges are presented. These challenges include increased variability in memory cell I-V characteristics, reduced memory cell sensing currents, and increased bit line settling times.

DETAILED DESCRIPTION

Figure 1A:
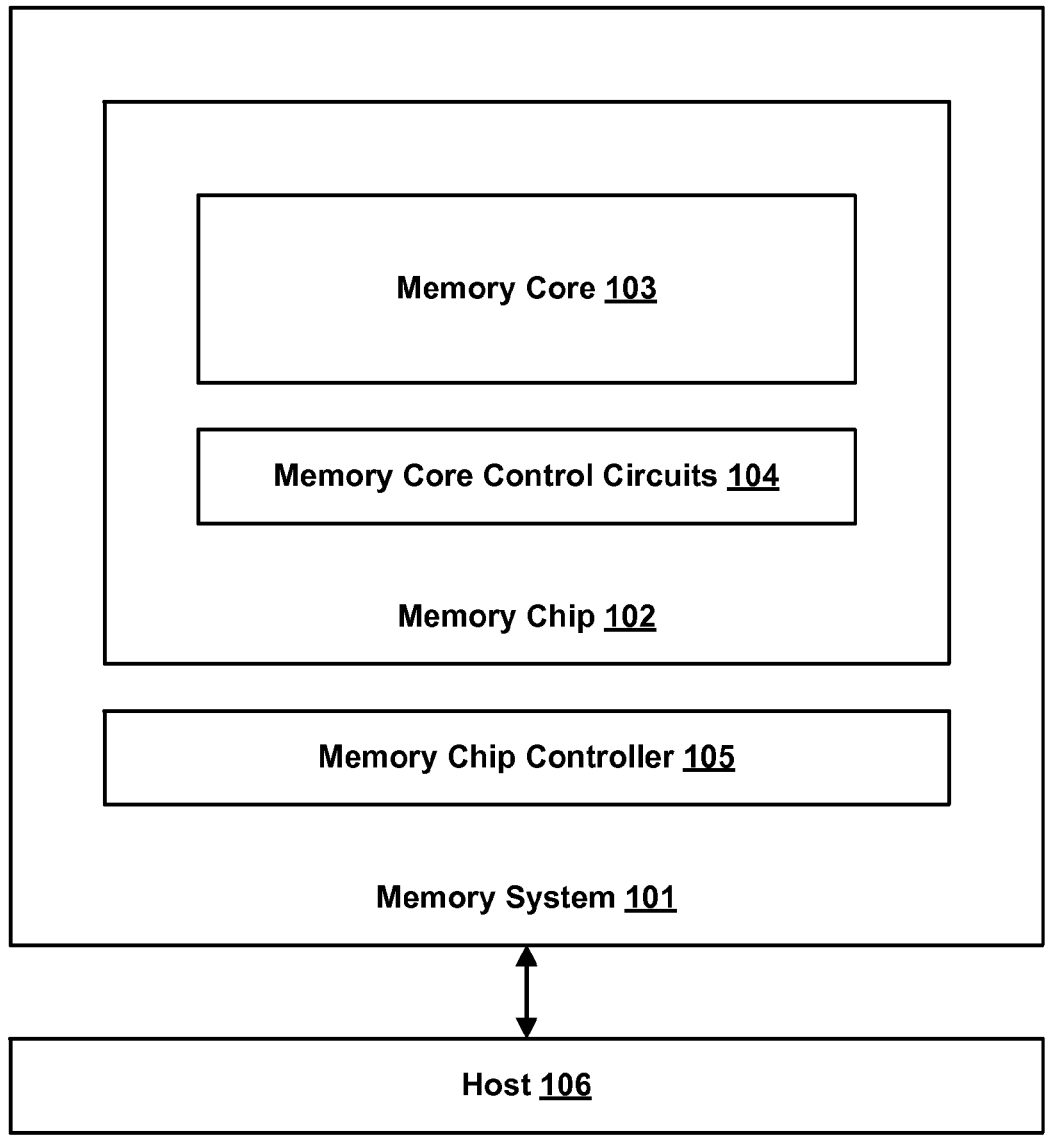
FIG. 1A depicts an embodiment of a memory system and a host.

Technology is described for a sense amplifier that includes a capacitor integrator having a single-transistor amplifier and a level shifter. The sense amplifier may be used to perform a read of a selected memory cell of a memory array with unselected bit lines at substantially 0V, unselected word lines at substantially 0V, a selected word line at a read voltage greater than 0V, and a selected bit line maintained at substantially 0V.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. Memory system 101 may include a non-volatile storage system interfacing with host 106 (e.g., a mobile computing device). In some cases, memory system 101 may be embedded within host 106. In other cases, memory system 101 may include a memory card. As depicted, memory system 101 includes a memory chip controller 105 and a memory chip 102. Although a single memory chip is depicted, memory system 101 may include more than one memory chip 102 (e.g., four or eight memory chips). Memory chip controller 105 may receive data and commands from host 106 and provide memory chip data to host 106. Memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within memory chip 102. Memory chip controller 105 and memory chip 102 may be arranged on a single integrated circuit. In other embodiments, memory chip controller 105 and memory chip 102 may be arranged on different integrated circuits. In some cases, memory chip controller 105 and memory chip 102 may be integrated on a system board, logic board, or a PCB.

Memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. Memory core 103 may include one or more two-dimensional arrays of memory cells or one or more three-dimensional arrays of memory cells. In one embodiment, memory core control circuits 104 and memory core 103 are arranged on a single integrated circuit. In other embodiments, memory core control circuits 104 (or a portion of the memory core control circuits) and memory core 103 may be arranged on different integrated circuits.

A memory operation may be initiated when host 106 sends instructions to memory chip controller 105 indicating that it would like to read data from memory system 101 or write data to memory system 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

The operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array. The one or more managing or control circuits may provide control signals to a memory array to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
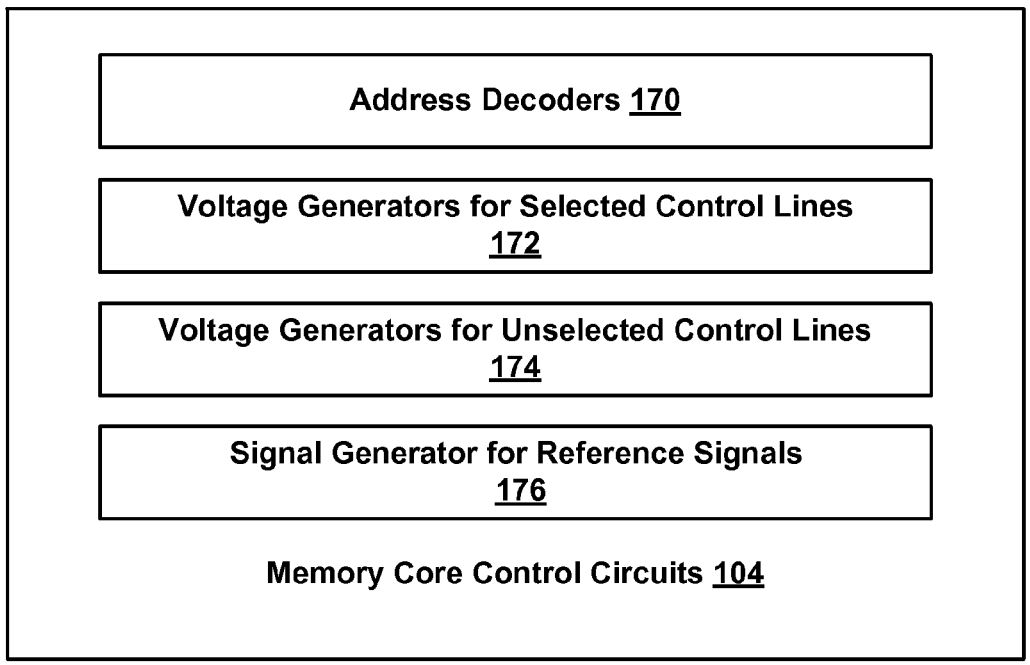
FIG. 1B depicts an embodiment of memory core control circuits.

FIG. 1B depicts one embodiment of memory core control circuits 104. As depicted, the memory core control circuits 104 include address decoders 170, voltage generators for selected control lines 172, voltage generators for unselected control lines 174 and signal generators for reference signals 176 (described in more detail below). Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state.

The voltage generators (or voltage regulators) for selected control lines 172 may include one or more voltage generators for generating selected control line voltages. The voltage generators for unselected control lines 174 may include one or more voltage generators for generating unselected control line voltages. The signal generators for reference signals 176 may include one or more voltage or current generators for generating reference voltage or current signals. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings can also be used with the technology described herein.

Figure 1C:
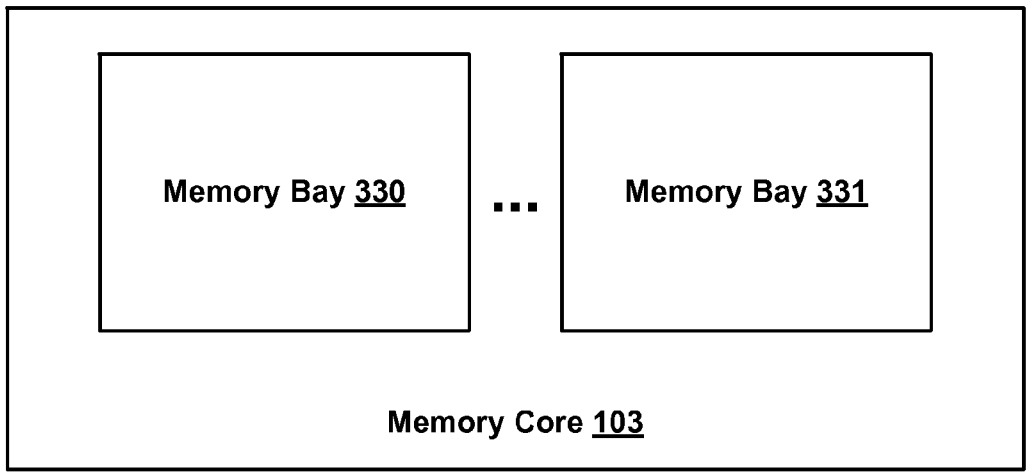
FIG. 1C depicts an embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
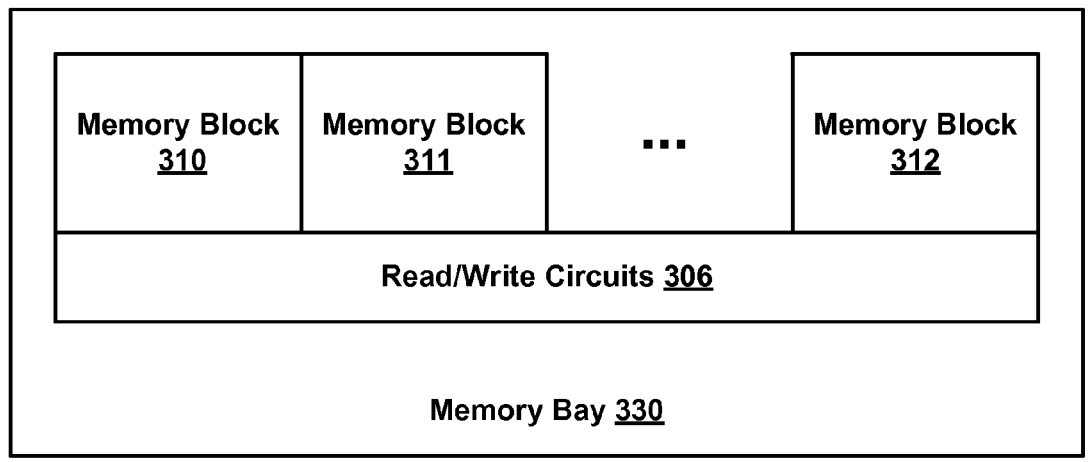
FIG. 1D depicts an embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay).

Read/write circuits 306 include circuitry for reading and writing memory cells within memory blocks 310-312. As depicted, read/write circuits 306 may be shared across multiple memory blocks within a memory bay. This allows chip area to be reduced because a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into memory blocks 310-312 (or into a subset of memory blocks 310-312). The memory cells within memory blocks 310-312 may permit direct over-writing of pages (e.g., data representing a page or a portion of a page may be written into memory blocks 310-312 without requiring an erase or reset operation to be performed on the memory cells prior to writing the data). In one example, memory system 101 may receive a write command including a target address and a set of data to be written to the target address. Memory system 101 may perform a read-before-write (RBW) operation to read the data currently stored at the target address and/or to acquire overhead information (e.g., ECC information) before performing a write operation to write the set of data to the target address.

In some cases, read/write circuits 306 may be used to program a particular memory cell to be in one of three or more data/resistance states (e.g., the particular memory cell may include a multi-level memory cell). In one example, read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
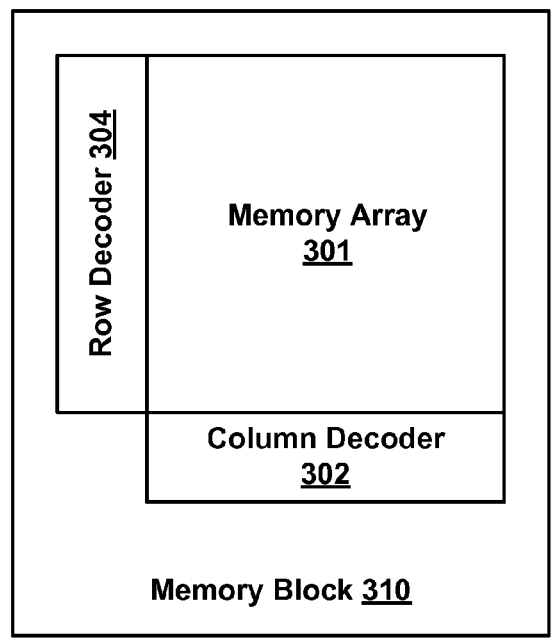
FIG. 1E depicts an embodiment of a memory block.

FIG. 1E depicts one embodiment of memory block 310 of FIG. 1D. As depicted, memory block 310 includes a memory array 301, row decoder 304, and column decoder 302. Memory array 301 may include a contiguous group of memory cells having contiguous word lines and bit lines. Memory array 301 may include one or more layers of memory cells. Memory array 301 may include a two-dimensional memory array or a three-dimensional memory array.

Row decoder 304 decodes a row address and selects a particular word line in memory array 301 when appropriate (e.g., when reading or writing memory cells in memory array 301). Column decoder 302 decodes a column address and selects a particular group of bit lines in memory array 301 to be electrically coupled to read/write circuits, such as read/write circuits 306 of FIG. 1D. In one embodiment, the number of word lines is 4K per memory layer, the number of bit lines is 1K per memory layer, and the number of memory layers is 4, providing a memory array 301 containing 16M memory cells.

Figure 1F:
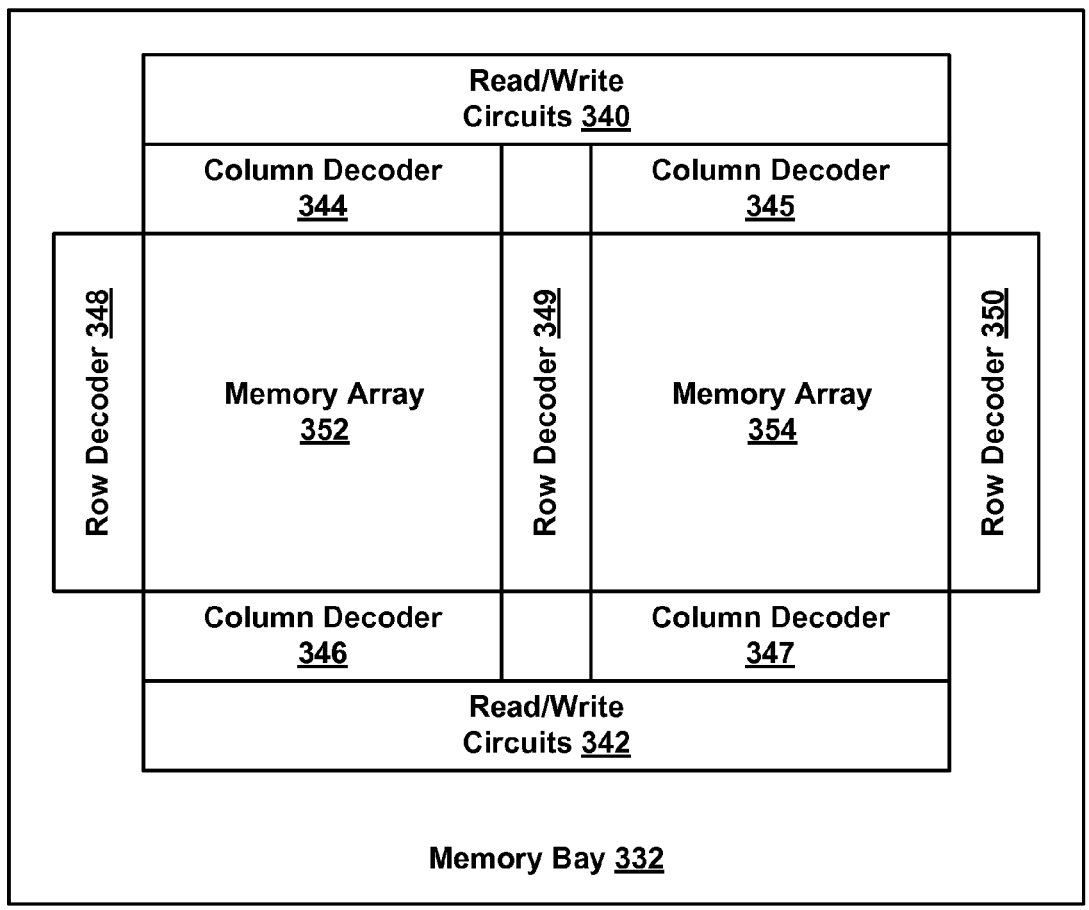
FIG. 1F depicts another embodiment of a memory bay.

FIG. 1F depicts one embodiment of a memory bay 332. Memory bay 332 is one example of an alternative implementation for memory bay 330 of FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (e.g., the word lines driven by row decoder 349 are shared). Row decoders 348 and 349 may be split such that even word lines in memory array 352 are driven by row decoder 348 and odd word lines in memory array 352 are driven by row decoder 349.

Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
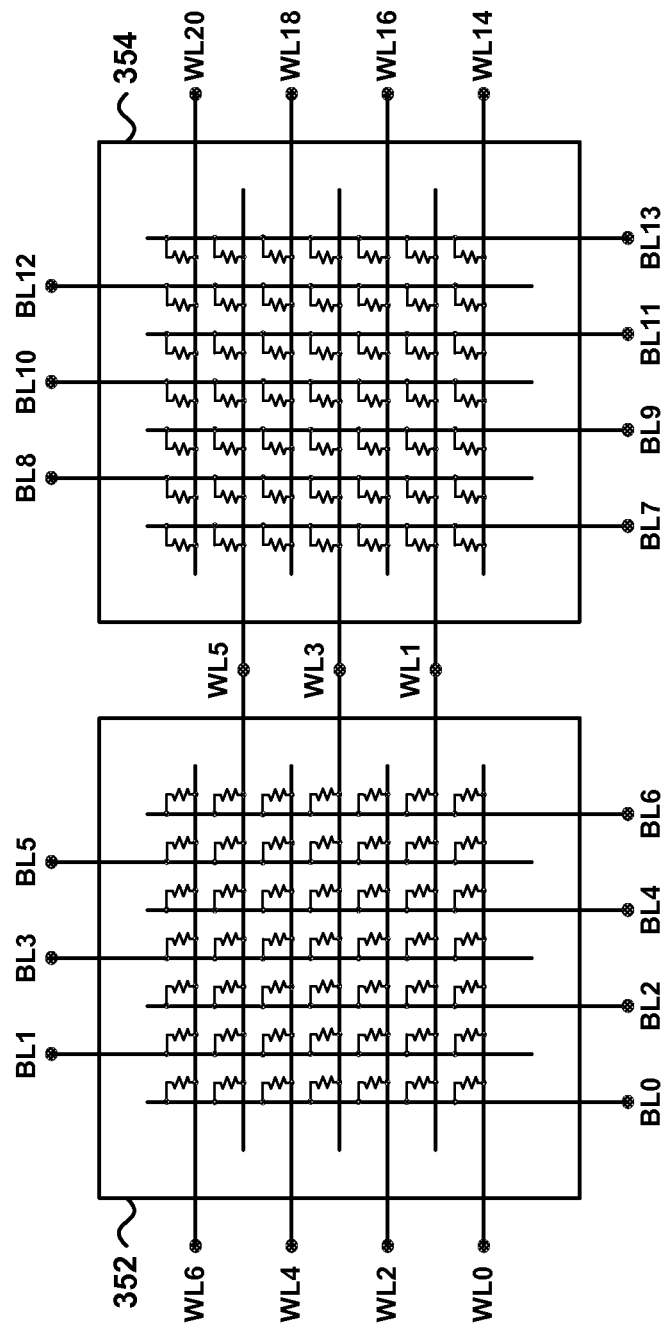
FIG. 2A depicts a schematic diagram of the memory bay of FIG. 1F.

FIG. 2A depicts one embodiment of a schematic diagram (including word lines and bit lines) corresponding to memory bay 332 of FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, memory arrays 352 and 354 may include memory layers that are oriented in a plane that is horizontal to the supporting substrate. In another embodiment, memory arrays 352 and 354 may include memory layers that are oriented in a vertical plane that is vertical with respect to the supporting substrate (i.e., the vertical plane is perpendicular to the supporting substrate).

Figure 2B:
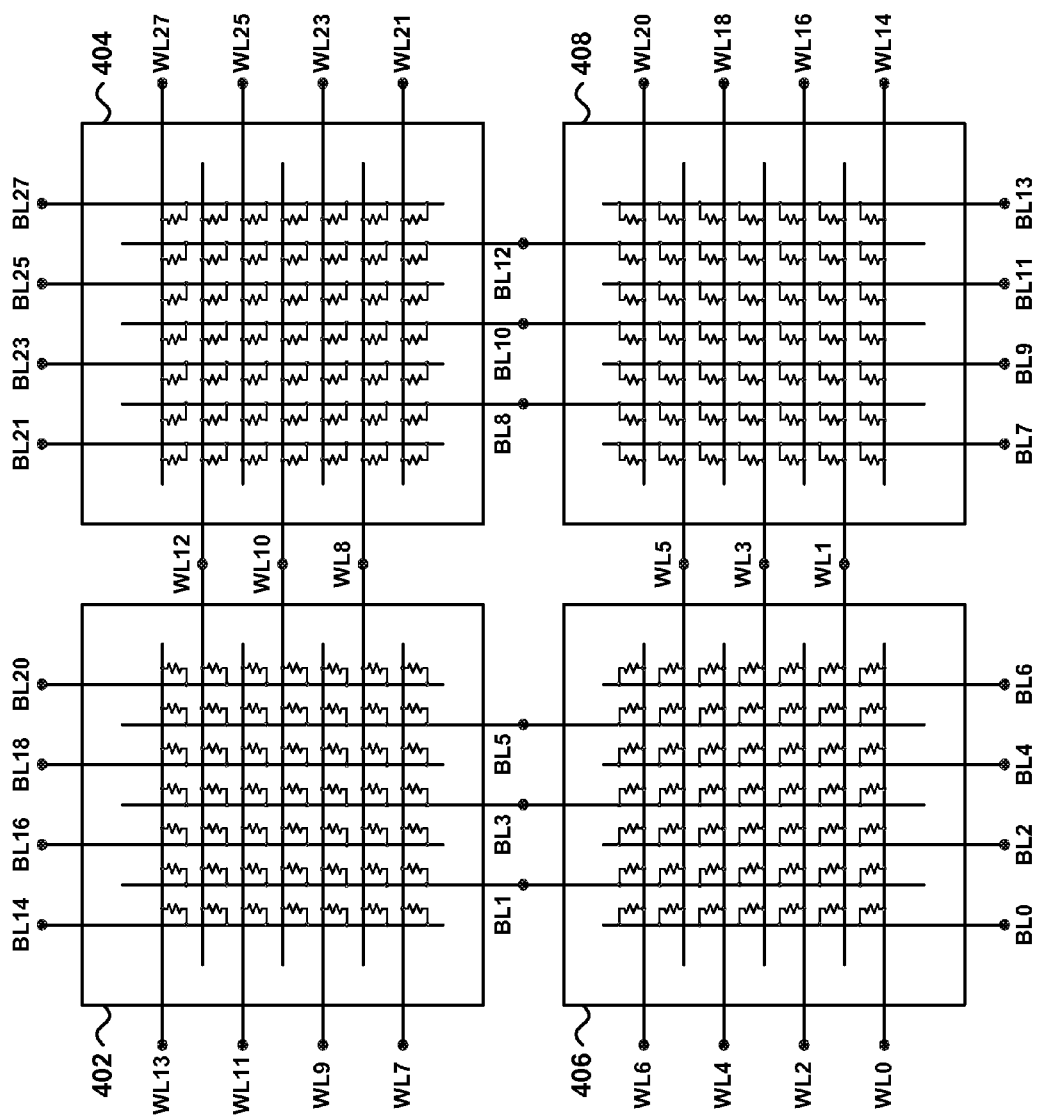
FIG. 2B depicts a schematic diagram of a memory bay arrangement wherein word lines and bit lines are shared across memory blocks, and both row decoders and column decoders are split.

FIG. 2B depicts one embodiment of a schematic diagram (including word lines and bit lines) corresponding to a memory bay arrangement wherein word lines and bit lines are shared across memory blocks, and both row decoders and column decoders are split. Sharing word lines and/or bit lines helps to reduce layout area because a single row decoder and/or column decoder can be used to support two memory arrays.

As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
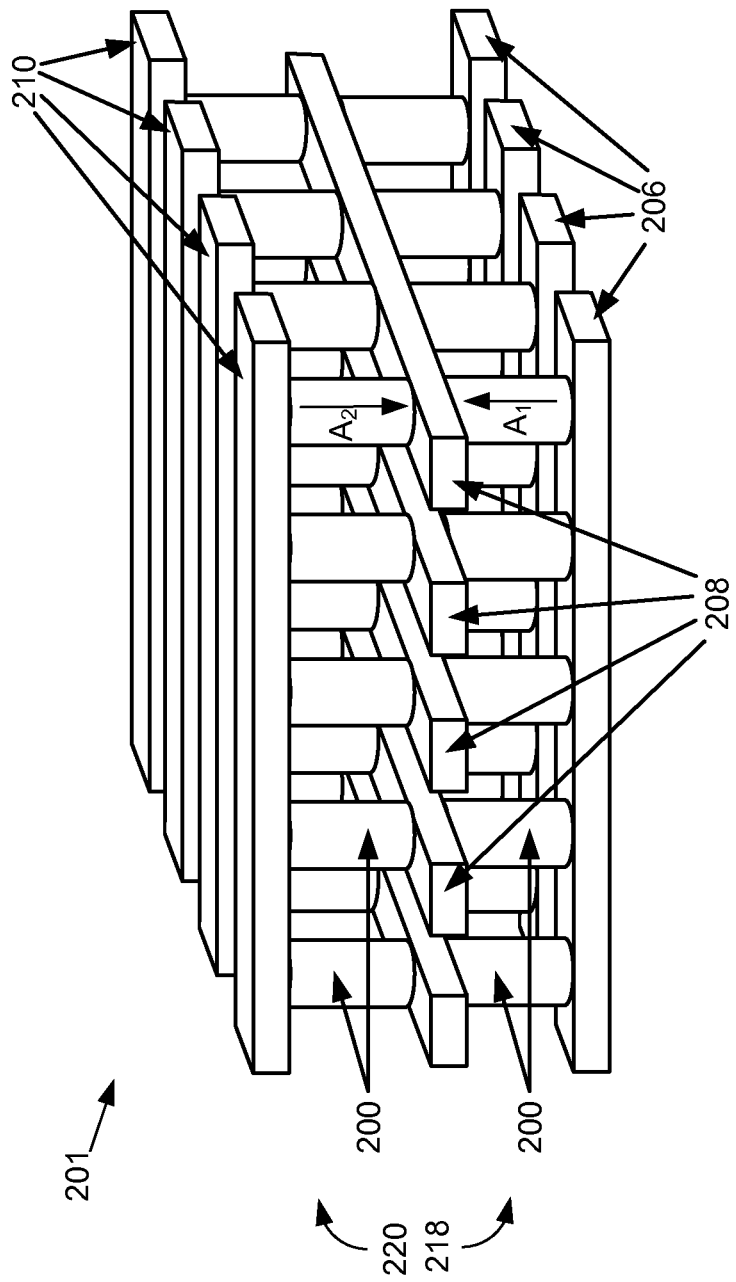
FIG. 3A depicts an embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 of FIG. 1E. Bit lines 206 and 210 are arranged in a first direction and word lines 208 are arranged in a second direction perpendicular to the first direction. As depicted, the upper conductors of first memory level 218 may be used as the lower conductors of second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. Memory cells 200 may include re-writeable memory cells. Memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element).

In one example, the diodes of first memory level 218 may be upward pointing diodes as indicated by arrow $A_1$ (e.g., with p regions at the bottom of the diodes), whereas the diodes of second memory level 220 may be downward pointing diodes as indicated by arrow $A_2$ (e.g., with n regions at the bottom of the diodes), or vice versa. In another embodiment, each memory cell includes only a state change element. The absence of a diode (or other steering element) from a memory cell may reduce the process complexity and costs associated with manufacturing a memory array.

In one embodiment, memory cells 200 of FIG. 3A include re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide, hafnium oxide, or other similar metal oxide. In another embodiment, the reversible resistance-switching material may include a phase change material. The phase change material may include a chalcogenide material. In some cases, the re-writeable non-volatile memory cells may include resistive RAM (ReRAM) devices.

In another embodiment, memory cells 200 of FIG. 3A may include conductive bridge memory elements. A conductive bridge memory element also may be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0," and another resistance state may represent a binary data "1." In some cases, a memory cell may be considered to include more than two data/resistance states (e.g., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0," and the low-resistivity state may be associated with binary data "1." In other embodiments, SETTING and RESETTING operations and/or the data encoding can be reversed. In some embodiments, the first time a resistance-switching element is SET may require a higher than normal programming voltage and may be referred to as a FORMING operation.

In one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, to prevent program disturb of unselected memory cells sharing the selected word line, the unselected bit lines may be biased such that a first voltage difference between the selected word line voltage and the unselected bit line voltage is less than a first disturb threshold.

To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
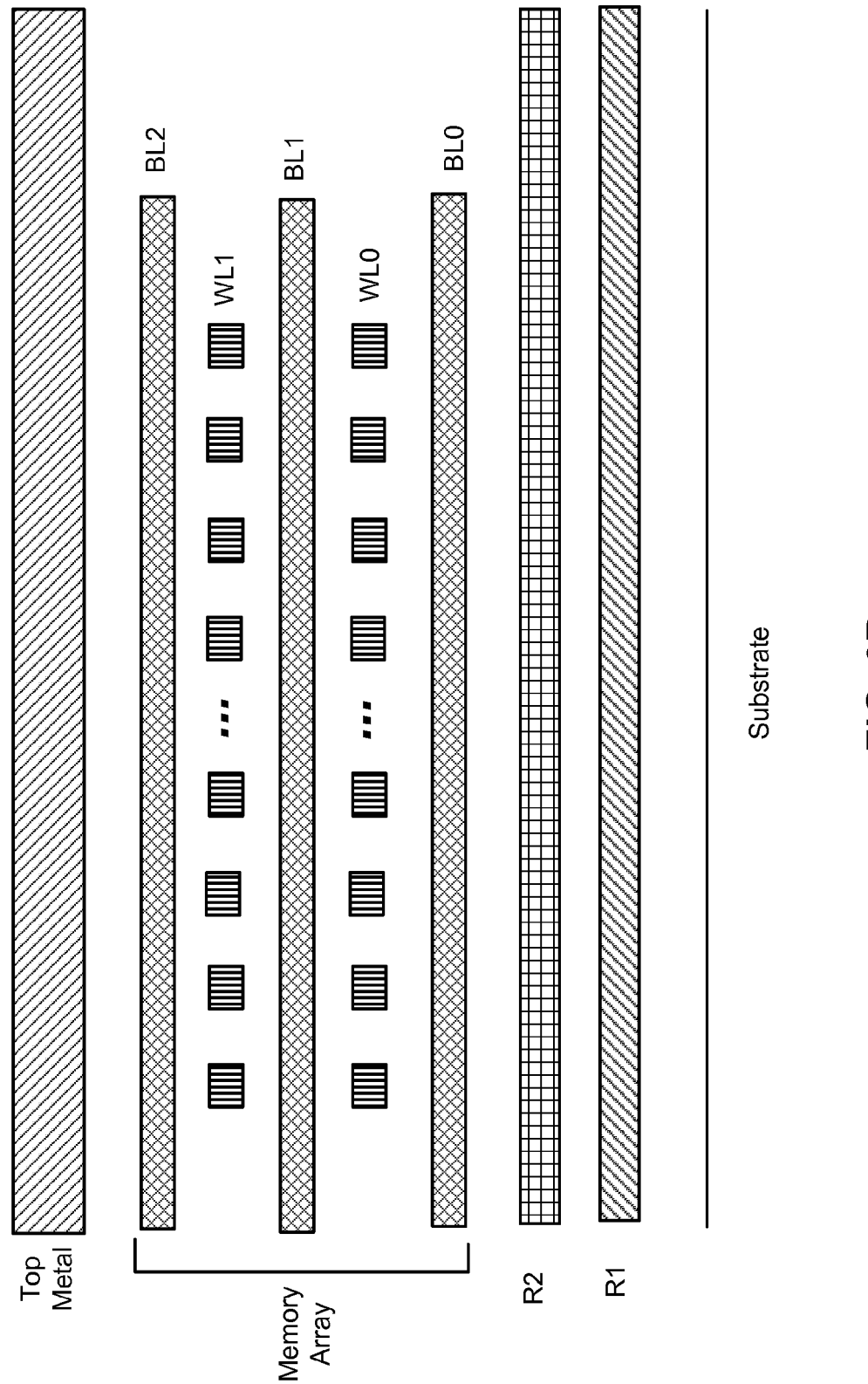
FIG. 3B depicts a subset of the memory array and routing layers of an embodiment of a three-dimensional memory array.

FIG. 3B depicts a subset of a memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers also can be implemented. Supporting circuitry (e.g., row decoders, column decoders, and read/write circuits) may be arranged on the surface of the Substrate with the Memory Array layers fabricated above the supporting circuitry.

An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

Two metal layers R1 and R2 are used for routing layers. However, other embodiments can include more or less than two metal layers. In one example, metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3C:
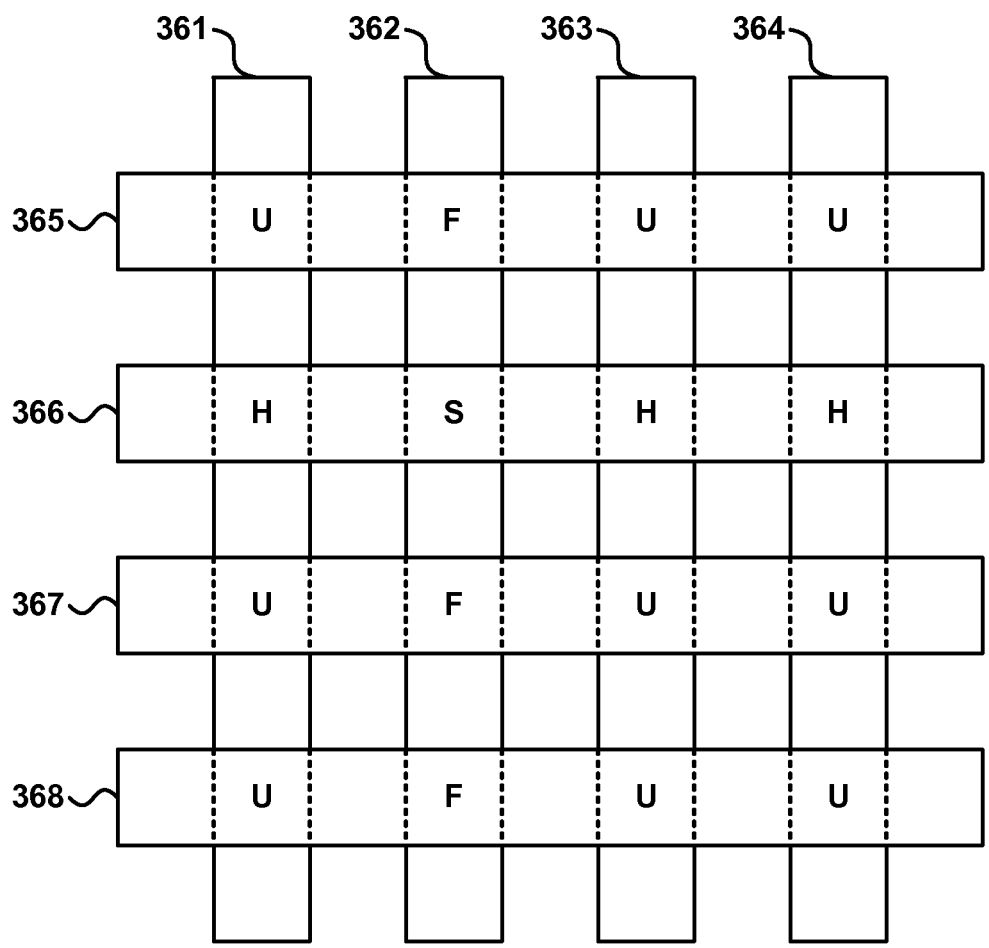
FIGS. 3C-3D depicts various embodiments of a cross-point memory array.

FIG. 3C depicts one embodiment of a cross-point memory array 360. Cross-point memory array 360 may correspond to memory array 201 in FIG. 3A. As depicted, cross-point memory array 360 includes word lines 365-368 and bit lines 361-364. Word line 366 includes a selected word line and bit line 362 includes a selected bit line. At the intersection of selected word line 366 and selected bit line 362 is a selected memory cell (an S cell). The voltage across the S cell is the difference between the selected word line voltage and the selected bit line voltage.

Memory cells at the intersections of selected word line 366 and unselected bit lines 361, 363, and 364 include unselected memory cells (H cells). H cells are unselected memory cells that share a selected word line that is biased to the selected word line voltage. The voltage across H cells is the difference between the selected word line voltage and the unselected bit line voltage.

Memory cells at the intersections of selected bit line 362 and unselected word lines 365, 367, and 368 include unselected memory cells (F cells). F cells are unselected memory cells that share a selected bit line that is biased to a selected bit line voltage. The voltage across F cells is the difference between the unselected word line voltage and the selected bit line voltage.

Memory cells at the intersections of the unselected word lines 365, 367, and 368 and the unselected bit lines 361, 363, and 364 include unselected memory cells (U cells). The voltage across U cells is the difference between the unselected word line voltage and the unselected bit line voltage.

The number of F cells is related to the length of the bit lines (or the number of memory cells connected to a bit line), whereas the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3D:
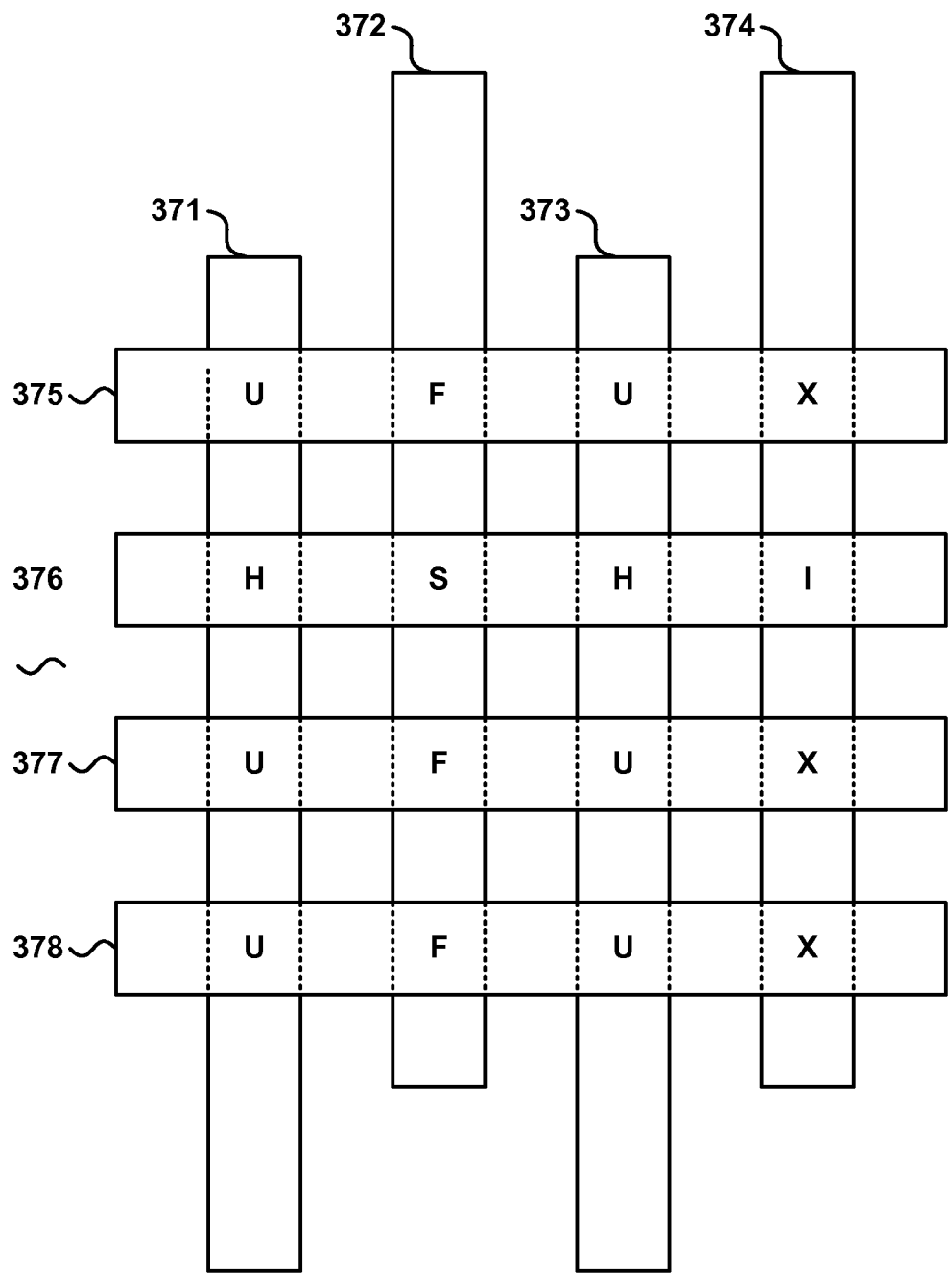

FIG. 3D depicts an alternative embodiment of a cross-point memory array 370. Cross-point memory array 370 may correspond to memory array 201 in FIG. 3A. As depicted, cross-point memory array 370 includes word lines 375-378 and bit lines 371-374. Word line 376 includes a selected word line and bit lines 372 and 374 include selected bit lines. Although both bit lines 372 and 374 are selected, the voltages applied to bit line 372 and bit line 374 may be different.

For example, in the case that bit line 372 is associated with a first memory cell to be programmed (e.g., an S cell), then bit line 372 may be biased to a selected bit line voltage to program the first memory cell. In the case that bit line 374 is associated with a second memory cell that is not to be programmed (e.g., an I cell), then bit line 374 may be biased to a program inhibit voltage (e.g., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of selected bit line 374 and unselected word lines 375, 377, and 378 include unselected memory cells (X cells). X cells are unselected memory cells that share a selected bit line that is biased to a program inhibit voltage.

The voltage across X cells is the difference between the unselected word line voltage and the program inhibit voltage. In one embodiment, the program inhibit voltage applied to selected bit line 374 may be similar to the unselected bit line voltage. In another embodiment, the program inhibit voltage may be a voltage that is greater than or less than the unselected bit line voltage.

For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and selected word line 376 is biased to the selected word line voltage, one or more other pages also associated with the selected word line 376 may include H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of cross-point memory array 370 may include resistive memory elements without isolating diodes. In one embodiment, the bit lines 372 and 373 may include vertical bit lines in a three dimensional memory array comprising comb shaped word lines.

Figure 4A:
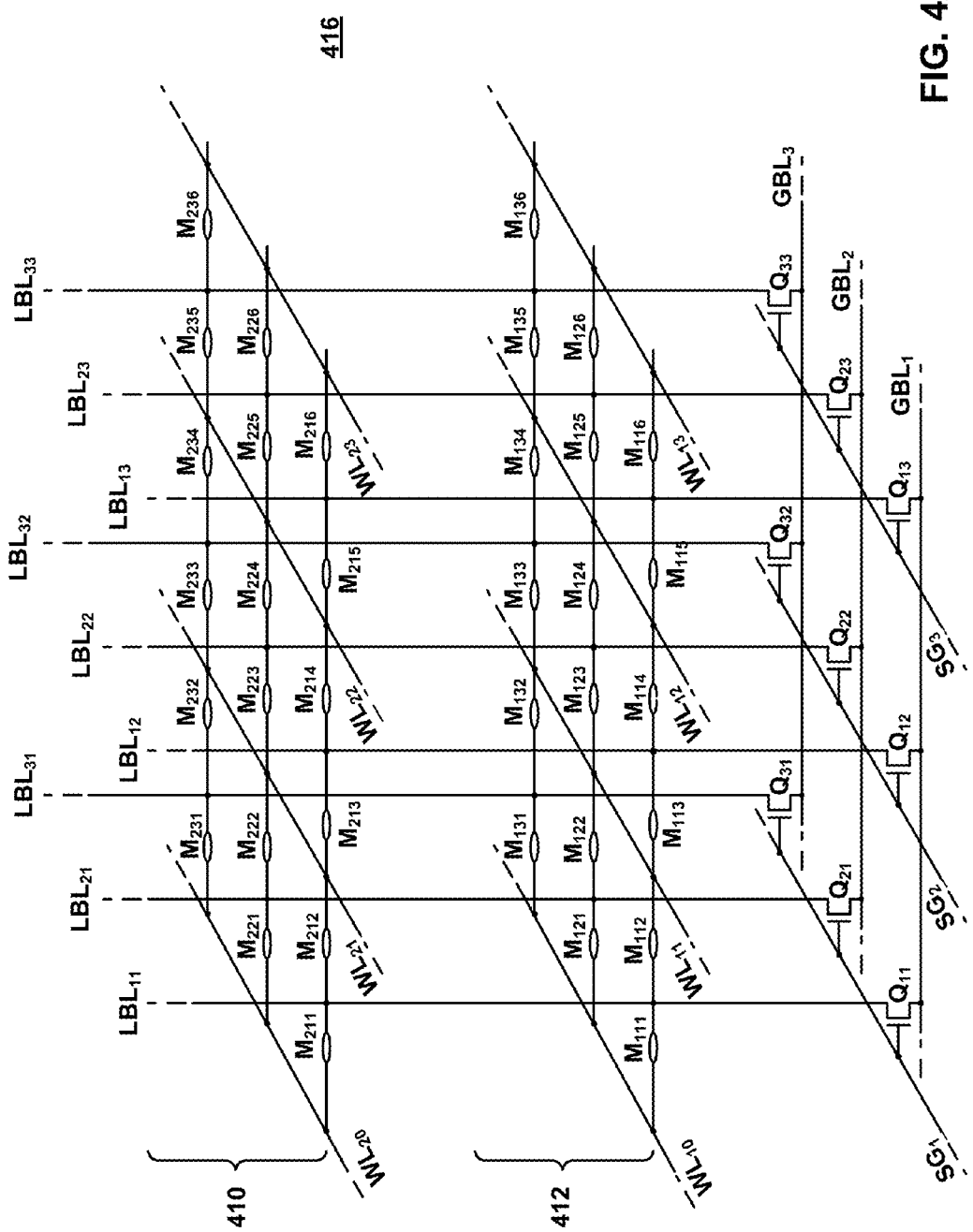
FIG. 4A depicts an embodiment of a portion of a monolithic three-dimensional memory array.

FIG. 4A depicts one embodiment of a portion of a monolithic three-dimensional memory array 416 that includes a first memory level 412 positioned below a second memory level 410. Memory array 416 is one example of an implementation of memory array 301 of FIG. 1E. Local bit lines $LBL_{11}$-$LBL_{33}$ are arranged in a first direction (i.e., a vertical direction) and word lines $WL_{10}$-$WL_{23}$ are arranged in a second direction perpendicular to the first direction. This arrangement of vertical bit lines in a monolithic three-dimensional memory array is one embodiment of a vertical bit line memory array.

As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate device or a charge trap device (e.g., using a silicon nitride material). Global bit lines $GBL_1$-$GBL_3$ are arranged in a third direction that is perpendicular to both the first direction and the second direction.

A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select local bit lines $LBL_{11}$-$LBL_{31}$ and to connect local bit lines $LBL_{11}$-$LBL_{31}$ to global bit lines $GBL_1$-$GBL_3$ using row select line $SG_1$. Similarly, bit line select devices $Q_{12}$-$Q_{32}$ are used to selectively connect local bit lines $LBL_{12}$-$LBL_{32}$ to global bit lines $GBL_1$-$GBL_3$ using row select line $SG_2$ and bit line select devices $Q_{13}$-$Q_{33}$ are used to selectively connect local bit lines $LBL_{13}$-$LBL_{33}$ to global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated.

In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
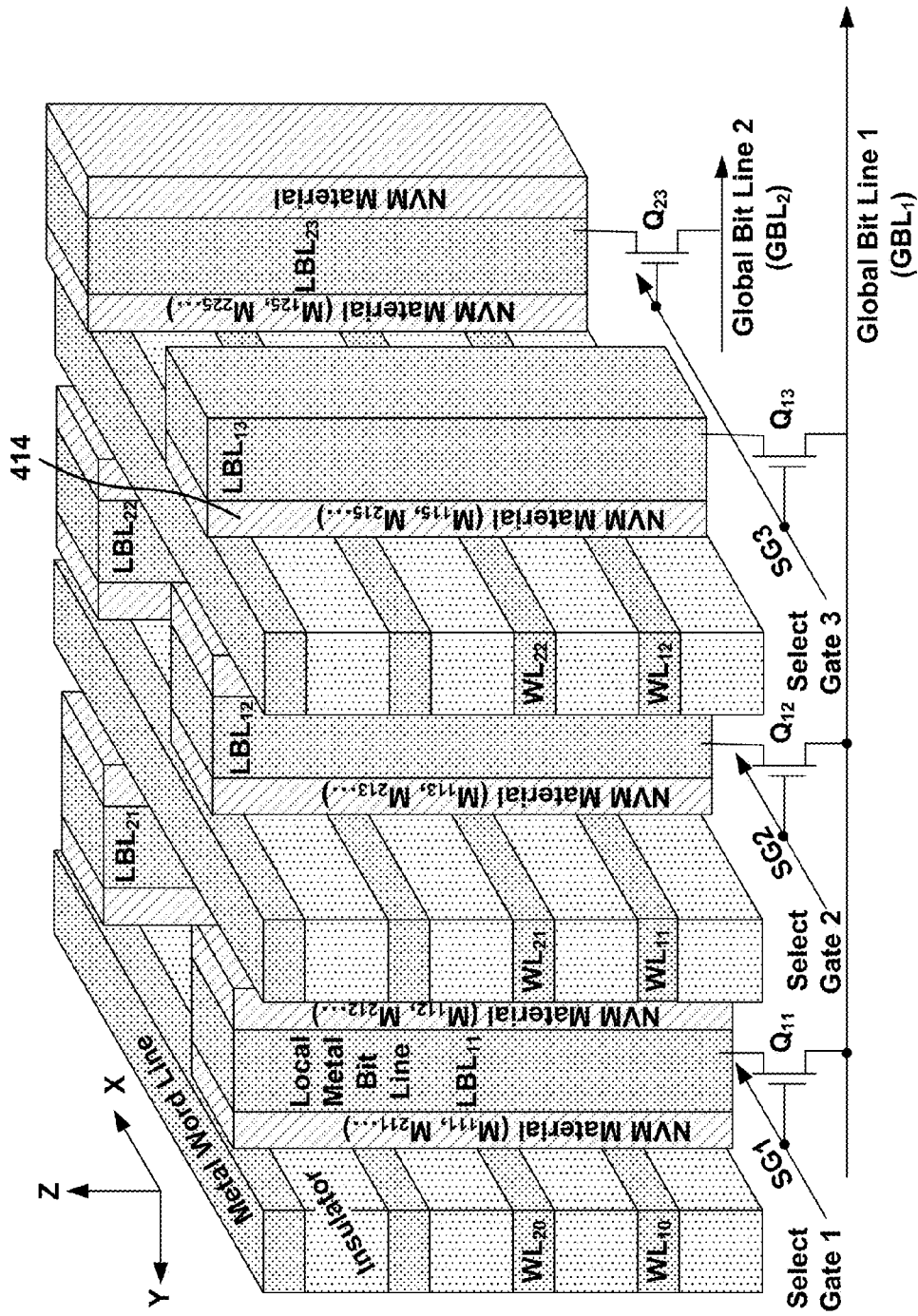
FIG. 4B depicts an embodiment of a portion of a monolithic three-dimensional memory array that includes vertical strips of a non-volatile memory material.

FIG. 4B depicts one embodiment of a portion of a monolithic three-dimensional memory array that includes vertical strips of a non-volatile memory material. The physical structure depicted in FIG. 4B may include one implementation for a portion of the monolithic three-dimensional memory array depicted in FIG. 4A. The vertical strips of non-volatile memory material may be formed in a direction that is perpendicular to a substrate (e.g., in the Z direction).

A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may include a single continuous layer of material that may be used by a plurality of memory cells or devices.

In one example, portions of the vertical strip of the non-volatile memory material 414 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may include a MOS device (e.g., an NMOS device) or a vertical TFT.

Figure 5A:
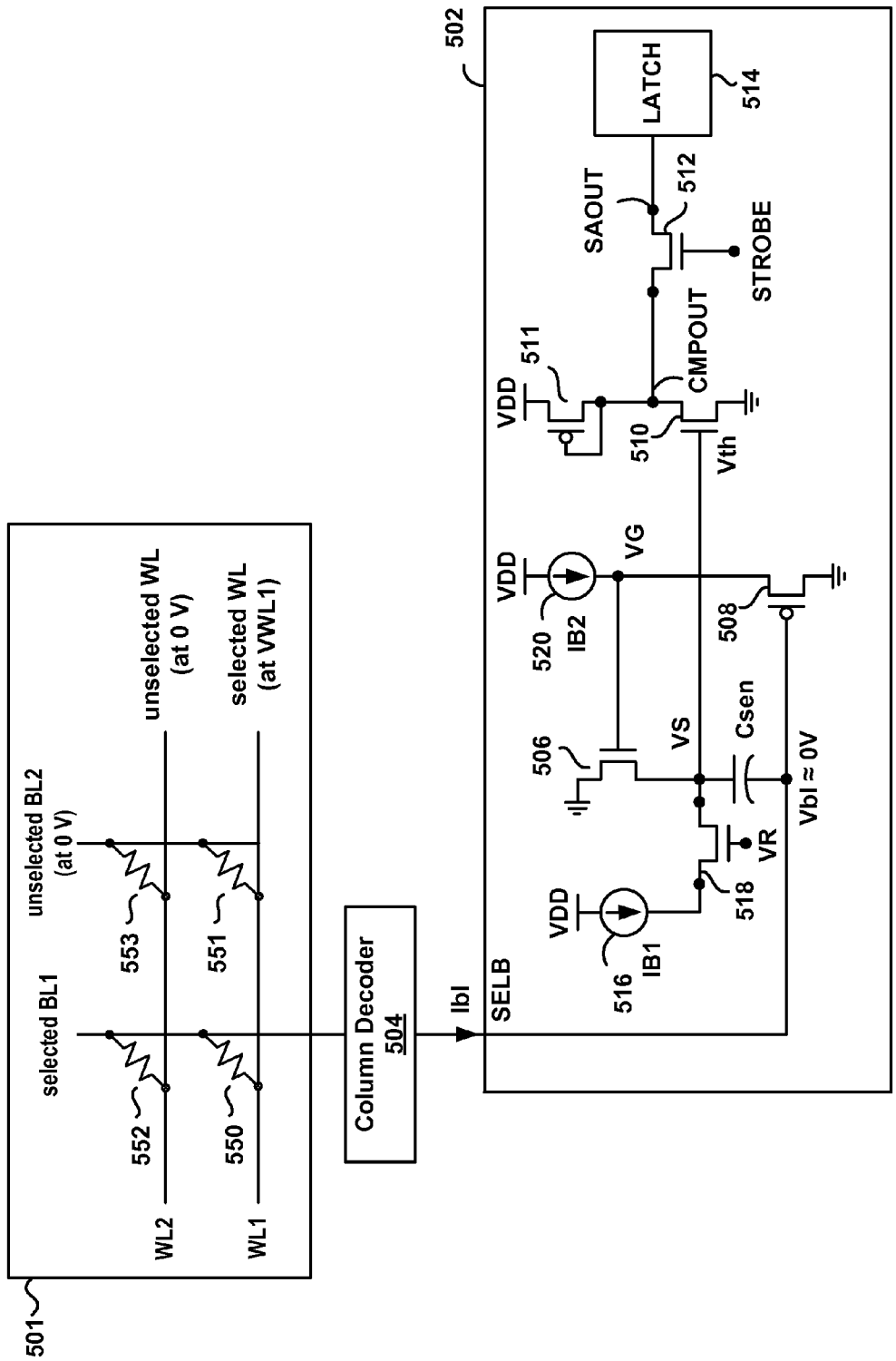
FIG. 5A depicts an embodiment of a sense amplifier and a portion of a memory array.

FIG. 5A depicts an embodiment of a sense amplifier 502 and a portion of a memory array 501. Sense amplifier 502 is an example of a portion of read/write circuit 306 in FIG. 1D. The portion of a memory array 501 includes two of the many bit lines (one selected bit line labeled "Selected BL1" and one unselected bit line labeled "Unselected BL") and two of the many word lines (one selected word line WL1 labeled "Selected WL" and one unselected word line WL2 "Unselected WL"). The portion of a memory array 501 also includes a selected memory cell 550 and unselected memory cells 551-553. In one embodiment, the portion of a memory array 501 may include a memory array with bit lines arranged in a direction horizontal to the substrate, such as memory array 201 in FIG. 3A. In another embodiment, the portion of a memory array 501 may include a memory array with bit lines arranged in a vertical direction that is perpendicular to the substrate, such as memory array 416 in FIG. 4A.

When the portion of memory array 501 is in a standby mode, all bit lines and all word lines are at 0V. During a memory array operation (e.g., a read operation), unselected word line WL2 remains biased 0V, selected word line WL1 may be biased to VWL1, and unselected bit line BL2 may be biased to 0V. As described below, in an embodiment, sense amplifier 502 operates to maintain selected bit line BL1 at Vbl at substantially 0V during a read operation. In this case, unselected memory cells (e.g., 551) sharing selected word line WL1 will be biased to the voltage difference between the selected word line voltage (VWL1) and the unselected bit line voltage (0V). In addition, unselected memory cells (e.g., 552, 553) sharing selected bit line BL1 will be biased to the voltage difference between the unselected word line voltage (0V) and the selected bit line voltage (Vbl=0V).

Sense amplifier 502 has an input terminal SELB, and includes a first transistor 506, a second transistor 508, a third transistor 510, a diode-connected transistor 511, a sampling transistor 512, a data latch 514, a first current source 516, a transistor 518, a second current source 520, and a capacitor Csen. Input terminal SELB of sense amplifier 502 may be electrically coupled to selected bit line BL1 via column decoder 504. In one embodiment, column decoder 504 may correspond to column decoder 302 depicted in FIG. 1E.

In an embodiment, first transistor 506 is an nMOS device having a threshold voltage Vtn, second transistor 508 is a pMOS device having a threshold voltage Vtp, and third transistor 510 is an nMOS device having a threshold voltage Vth. In an embodiment, |Vtn| substantially equals |Vtp|≈0.7 V. In other embodiments, |Vtn| and |Vtp| may have values other than 0.7V, and need not have substantially the same value. In an embodiment, Vth≈0.7, although other values may be used. In some embodiments, Vtn may be less than Vtp.

First transistor 506 has a first terminal (e.g., a source terminal) coupled to a GROUND terminal, a second terminal (e.g., a gate terminal) coupled to a first terminal (e.g., a source terminal) VG of second transistor 508, and a third terminal (e.g., a drain terminal) VS coupled to a first terminal of capacitor Csen. Capacitor Csen has a second terminal coupled at node Vbl to a second terminal (e.g., a gate terminal) of second transistor 508, which has a third terminal (e.g., a drain terminal) coupled to the GROUND terminal. First current source 516 is coupled via transistor 518 to the drain terminal of first transistor 506 and the first terminal of capacitor Csen at node VS, and second current source 520 is coupled to the gate terminal of first transistor 506 and the source terminal VG of third transistor 508. Transistor 518 is controlled by a signal VR.

Capacitor Csen may have a value between about 10 fF and about 100 fF. First current source 516 has a second terminal coupled to a positive supply VDD, conducts a current IB1, and is used to pre-charge capacitor Csen and node VS to an initial value VS0, described in more detail below. IB1 may have a value between about 500 nA and about 1 μA, although other values may be used. Second current source 520 has a second terminal coupled to positive supply VDD, conducts a current IB2, and functions to keep second transistor 508 in saturation, and keep the VG node voltage at a threshold voltage Vtp (~0.7V) above GROUND. IB2 may have a value between about 500 nA and about 1 μA, although other values may be used.

Third transistor 510 has a first terminal (e.g., a drain terminal) CMPOUT coupled to a first terminal (e.g., a drain terminal) and a second terminal (e.g., a gate terminal) of diode-connected transistor 511, a second terminal (e.g., a gate terminal) coupled to the drain terminal of first transistor 506 and the first terminal of capacitor Csen at node VS, and a third terminal (e.g., a source terminal) coupled to the GROUND terminal. Diode-connected transistor 511 has a third terminal (e.g., a source terminal) coupled to positive supply VDD. Persons of ordinary skill in the art will understand that diode-connected transistor 511 alternatively may be any load circuit coupled to the positive supply terminal VDD.

The drain terminal CMPOUT of third transistor 510 also is coupled to a first terminal (e.g., a drain terminal) of sampling transistor 512, which has a second terminal (e.g., a source terminal) coupled to an output terminal SAOUT of sense amplifier 502, and a third terminal (e.g., a gate terminal) that is coupled to a strobe signal STROBE. Output terminal SAOUT is coupled to data latch 514. Each time strobe signal STROBE pulses HIGH, sampling transistor 512 turns ON, and the output terminal CMPOUT of comparator 5106 is coupled to data latch 514.

Figure 5B:
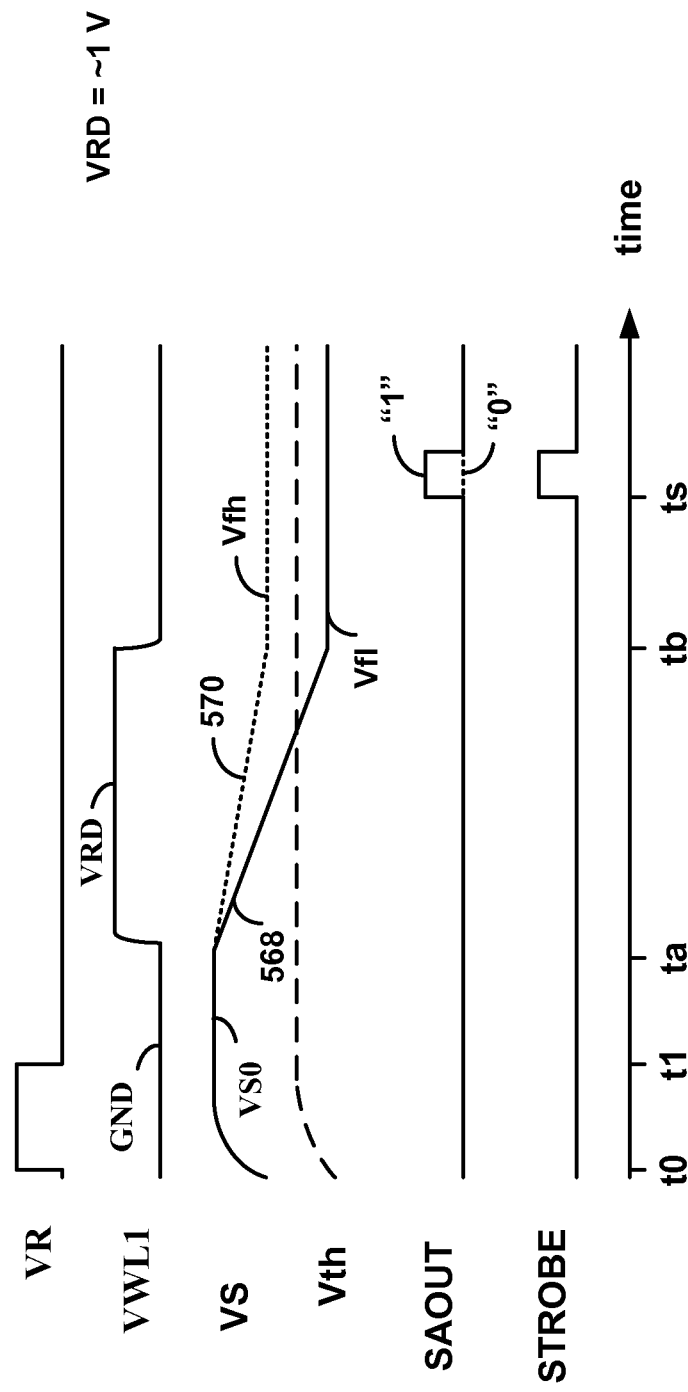
FIG. 5B depicts an example timing diagram of various signals for the embodiment of FIG. 5A.

Referring to FIGS. 5A and 5B, in an embodiment, during a read operation, sense amplifier 502 regulates selected bit line BL1 to the selected bit line voltage Vbl=0V. Between time t0 and t1, prior to sensing data, VR signal goes HIGH and turns transistor 518 ON, and pre-charges the VS node to an initial value VS0. In an embodiment, initial value VS0=~1.7 V, although other values may be used. The voltage across selected memory cell 550 is 0V, and bit line current Ibl=0.

Second transistor 508 is in saturation, and operates as a level shifter. The voltage at the source terminal VG of second transistor 508 is at one Vtp (~0.7V) above the voltage at the gate terminal Vbl (0V) of second transistor 508. The voltage at node VG is also one Vtn above the voltage at the source terminal of first transistor 506, and thus transistor 506 is ON, and the drain-to-source voltage of first transistor 506 is equal to the voltage across capacitor Csen. First transistor 506 functions as a single-transistor amplifier, and functions to keep the selected bit line voltage Vbl at 0V. In particular, if Vbl increases above 0V, second transistor 508 conducts less current, voltage at node VG increases, which increases the gate drive of first transistor 506, which tends to pull nodes VS and Vbl down toward 0V.

Referring to FIG. 5B, at time t1, VR goes LOW and transistor 518 turns OFF, VWL1=GROUND, VS=VS0, SAOUT=LOW and STROBE=LOW. At time ta, selected word line signal VWL1 is pulled to a read voltage VRD, causing cell current Ibl to flow through selected memory cell 550 and selected bit line BL1. Read voltage VRD is greater than 0V. In an embodiment, read voltage VRD=~1 V, although other voltages may be used. The second (gate) terminal of second transistor 508 has a high input impedance, and the only path for the selected bit line current Ibl is through sense capacitor Csen. Thus, the selected bit line current Ibl is integrated on sense capacitor Csen, and begins to discharge sense capacitor Csen. The VS node voltage is:

$$VS = VS0 - \int \frac{Ibl}{Csen} dt$$

Ibl discharges capacitor Csen at a rate determined by the resistance of selected memory cell 550. If selected memory cell 550 is in a low resistance state (e.g., a SET state), selected bit line current Ibl=Ibl$_L$, and the selected bit line current Ibl will discharge capacitor Csen as shown in trace 568. In contrast, if selected memory cell 550 is in a high resistance state (e.g., a RESET state), the selected bit line current Ibl=Ibl$_H$, and the selected bit line current Ibl will discharge capacitor Csen at a lower rate, as shown in trace 570.

At time tb, word line signal VWL1 is pulled to GROUND, selected memory cell 550 has 0V across it, and the selected bit line current Ibl goes to 0. Thus, the VS node voltage on capacitor Csen remains constant at a final value Vfl (if the selected memory cell 550 is in a low resistance state) or Vfh (if the selected memory cell 550 is in a high resistance state).

Third transistor 510 and diode-connected transistor 511 function as a comparator, with an output at the drain terminal CMPOUT of third transistor 510 having a value based on a comparison between the voltage at the gate terminal VS of third transistor 510 and a reference voltage equal to the threshold voltage of third transistor 510. If the VS node voltage has a final value Vfl, the VS node voltage is lower than the threshold voltage Vth of third transistor 510, third transistor 510 is OFF, the drain terminal CMPOUT of third transistor 510 is pulled HIGH by diode-connected transistor 511. In contrast, if the VS node voltage has a final value Vfh, the VS node voltage is higher than threshold voltage Vth of third transistor 510, third transistor 510 is ON, the drain terminal CMPOUT of third transistor 510 is pulled LOW.

At time ts, strobe signal STROBE goes HIGH, coupling the drain terminal CMPOUT of third transistor 510 to data latch 514. If the VS node voltage has a final value Vfl, the drain terminal CMPOUT of third transistor 510 is HIGH, and SAOUT=CMPOUT is HIGH, which is stored as a value of data "1" in data latch 514. In contrast, if the VS node voltage has a final value Vfh, the drain terminal CMPOUT of third transistor 510 is LOW, and SAOUT=CMPOUT is LOW, which is stored as a value of data "0" in data latch 514. Outputting a data "0" represents that the selected memory cell 550 is in a high resistance state, and outputting a data "1"

represents that the selected memory cell 550 is in a low resistance state. Data latch 514 latches the strobed output SAOUT.

Figure 6:
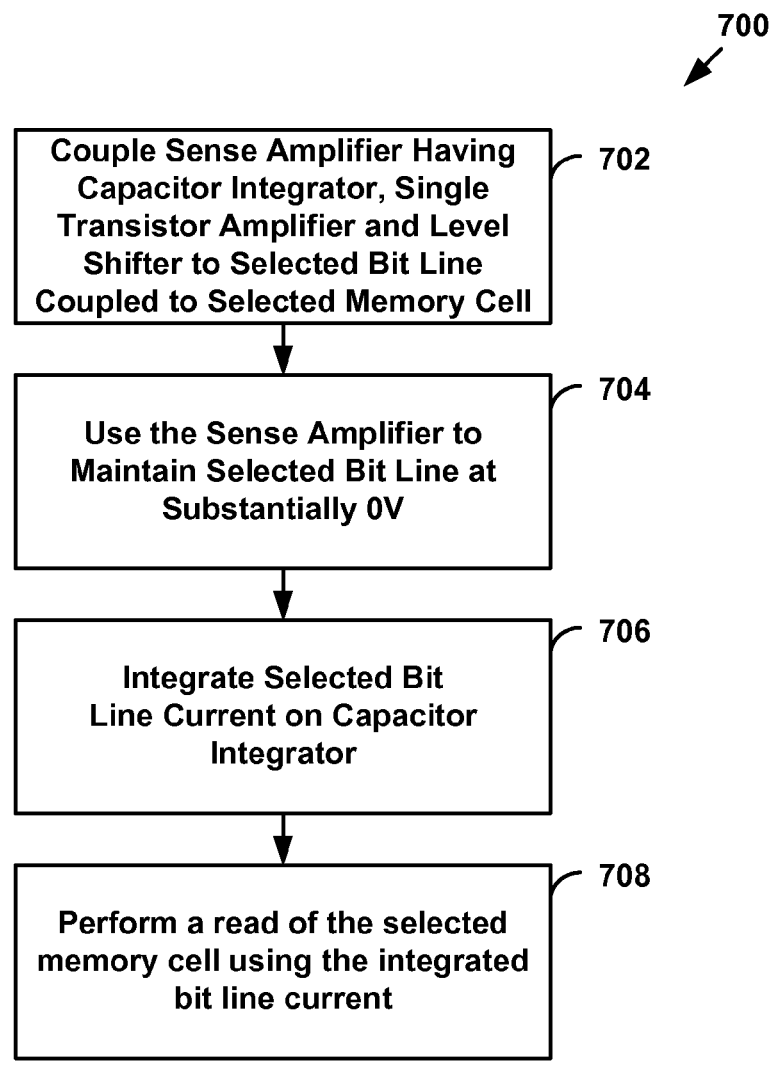
FIG. 6 is a flow diagram of a method embodiment.

FIG. 6 depicts an embodiment of a method 700 of the disclosed technology. In particular at step 702, a sense amplifier (e.g., sense amplifier 502 of FIG. 5A) is coupled to a selected bit line (e.g., BL1 of FIG. 5A) that is coupled to a selected memory cell (e.g., selected memory cell 550 of FIG. 5A). The sense amplifier includes a capacitor integrator, a single transistor amplifier and a level shifter (e.g., capacitor Csen, first transistor 506 and second transistor 508 of FIG. 5A). At step 704, the sense amplifier is used to maintain the selected bit line at substantially 0V. For example, as described above, sense amplifier 502 of FIG. 5A is used to maintain selected bit line BL1 at substantially 0V. At step 706, a bit line current conducted by the selected bit line is integrated on the capacitor integrator. For example, as described above, selected bit line current Ibl is integrated on capacitor Csen of FIG. 5A. At step 708, a read is performed using the integrated bit line current. For example, as described above, third transistor 510 of FIG. 5A is used to perform a read of selected memory cell 550 using the integrated selected bit line current Ibl.

One embodiment of the disclosed technology includes a method for use with a memory array that includes a selected memory cell coupled to a selected word line and a selected bit line, with the selected word line biased at a read voltage. The method includes coupling a sense amplifier to the selected bit line, the sense amplifier including a capacitor integrator, a single-transistor amplifier and a level shifter, maintaining the selected bit line at a voltage of substantially 0V using the single-transistor amplifier and the level shifter, and integrating a selected bit line current on the capacitor integrator.

One embodiment of the disclosed technology includes a sense amplifier for use with a memory array that includes a selected memory cell coupled to a selected word line and a selected bit line, the selected word line biased at a read voltage. The sense amplifier includes an input terminal coupled to the selected bit line and coupled to a first terminal of a capacitor, a first transistor including a first terminal coupled to a second terminal of the capacitor, a second terminal and a third terminal coupled to a GROUND terminal, a second transistor including a first terminal coupled to the second terminal of the first transistor, a second terminal coupled to the first terminal of the capacitor, and a third terminal coupled to the GROUND terminal, a first current source coupled between a positive supply terminal and the second terminal of the capacitor, a second current source coupled between the positive supply terminal and the first terminal of the second transistor, a third transistor including a first terminal coupled to an output terminal of the sense amplifier, a second terminal coupled to the second terminal of the capacitor, and a third terminal coupled to the GROUND terminal, and a load circuit coupled between the positive supply terminal and the first terminal of the third transistor.

One embodiment of the disclosed technology includes a method for use with a memory array comprising a selected memory cell coupled to a selected word line and a selected bit line, the selected word line biased at a read voltage, the method including coupling the selected bit line to a first terminal of a capacitor, coupling a first terminal of a first transistor to a second terminal of the capacitor, coupling a third terminal of the first transistor to a GROUND terminal, coupling a first terminal of a second transistor to a second terminal of the first transistor, coupling a second terminal of the second transistor to the first terminal of the capacitor, coupling a third terminal of the second transistor to the GROUND terminal, coupling a first current source between a positive supply terminal and the second terminal of the capacitor, coupling a second current source between the positive supply terminal and the first terminal of the second transistor, coupling a first terminal of a third transistor comprising to an output terminal of the sense amplifier, coupling, a second terminal of the third transistor to the second terminal of the capacitor, coupling a third terminal of the third transistor to the GROUND terminal, and coupling a load circuit coupled between the positive supply terminal and the first terminal of the third transistor.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method for use with a memory array comprising a selected memory cell coupled to a selected word line and a selected bit line, the selected word line biased at a read voltage, the method comprising:
   coupling a sense amplifier to the selected bit line, the sense amplifier comprising a capacitor integrator, a single-transistor amplifier and a level shifter, wherein the capacitor integrator has a first terminal coupled to the single-transistor amplifier, and a second terminal coupled to a control terminal of the level shifter;
   maintaining the selected bit line at a voltage of substantially 0V using the single-transistor amplifier and the level shifter;
   integrating a selected bit line current on the capacitor integrator; and
   performing a read of the selected memory cell using the integrated selected bit line current.

2. The method of claim 1, wherein the read voltage is greater than 0V.

3. The method of claim 1, wherein:
   the single-transistor amplifier comprises a first transistor that comprises an n-MOS transistor comprising a threshold voltage;
   the level shifter comprises a second transistor that comprises a p-MOS transistor comprising a threshold voltage; and
   a magnitude of the threshold voltage of the first transistor is less than or substantially equal to a magnitude of the threshold voltage of the second transistor.

4. The method of claim 1, further comprising comparing the integrated bit line current to a reference voltage.

5. The method of claim 1, further comprising:
coupling an output of the capacitor integrator to a third transistor;
turning ON the third transistor if the selected bit line current has a first predetermined value; and
turning OFF the third transistor if the selected bit line current has a second predetermined value.

6. A sense amplifier for use with a memory array comprising a selected memory cell coupled to a selected word line and a selected bit line, the selected word line biased at a read voltage, the sense amplifier comprising:
an input terminal coupled to the selected bit line and coupled to a first terminal of a capacitor;
a first transistor comprising a first terminal coupled to a second terminal of the capacitor, a second terminal and a third terminal coupled to a GROUND terminal;
a second transistor comprising a first terminal coupled to the second terminal of the first transistor, a second terminal coupled to the first terminal of the capacitor, and a third terminal coupled to the GROUND terminal;
a first current source coupled between a positive supply terminal and the second terminal of the capacitor;
a second current source coupled between the positive supply terminal and the first terminal of the second transistor;
a third transistor comprising a first terminal coupled to an output terminal of the sense amplifier, a second terminal coupled to the second terminal of the capacitor, and a third terminal coupled to the GROUND terminal; and
a load circuit coupled between the positive supply terminal and the first terminal of the third transistor.

7. The sense amplifier of claim 6, wherein the read voltage is greater than 0V.

8. The sense amplifier of claim 6, wherein the sense amplifier is configured to maintain the selected bit line at a voltage of substantially 0V.

9. The sense amplifier of claim 6, wherein the first transistor and the second transistor and capacitor are configured to maintain the selected bit line at a voltage of substantially 0V.

10. The sense amplifier of claim 6, wherein:
the first transistor comprises an n-MOS transistor comprising a threshold voltage;
the second transistor comprises a p-MOS transistor comprising a threshold voltage; and
a magnitude of the threshold voltage of the first transistor is less than or substantially equal to a magnitude of the threshold voltage of the second transistor.

11. The sense amplifier of claim 6, wherein the third transistor comprises an n-MOS transistor.

12. The sense amplifier of claim 6, wherein the capacitor comprises a capacitance value between about 10 fF and about 100 fF.

13. The sense amplifier of claim 6, wherein the load circuit comprises a diode-connected p-MOS transistor.

14. The sense amplifier of claim 6, wherein the first current source is configured to selectively charge the capacitor to an initial voltage.

15. The sense amplifier of claim 6, wherein the second current source is configured to bias the second transistor in saturation.

16. A method for use with a memory array comprising a selected memory cell coupled to a selected word line and a selected bit line, the selected word line biased at a read voltage, the method comprising:
coupling the selected bit line to a first terminal of a capacitor;
coupling a first terminal of a first transistor to a second terminal of the capacitor;
coupling a third terminal of the first transistor to a GROUND terminal;
coupling a first terminal of a second transistor to a second terminal of the first transistor;
coupling a second terminal of the second transistor to the first terminal of the capacitor;
coupling a third terminal of the second transistor to the GROUND terminal;
coupling a first current source between a positive supply terminal and the second terminal of the capacitor;
coupling a second current source between the positive supply terminal and the first terminal of the second transistor;
coupling a first terminal of a third transistor comprising to an output terminal of the sense amplifier;
coupling, a second terminal of the third transistor to the second terminal of the capacitor;
coupling a third terminal of the third transistor to the GROUND terminal; and
coupling a load circuit coupled between the positive supply terminal and the first terminal of the third transistor.

17. The method of claim 16, wherein the read voltage is greater than 0V.

18. The method of claim 16, further comprising using the first transistor and the second transistor to maintain the selected bit line at a voltage of about 0V.

19. The method of claim 16, wherein:
the first transistor comprises an n-MOS transistor comprising a threshold voltage;
the second transistor comprises a p-MOS transistor comprising a threshold voltage; and
a magnitude of the threshold voltage of the first transistor is less than or substantially equal to a magnitude of the threshold voltage of the second transistor.

20. The method of claim 16, wherein the third transistor comprises an n-MOS transistor.

* * * * *